United States Patent
Koh et al.

(10) Patent No.: US 7,540,970 B2
(45) Date of Patent: Jun. 2, 2009

(54) METHODS OF FABRICATING A SEMICONDUCTOR DEVICE

(75) Inventors: Cha-Won Koh, Yongin-si (KR);
Sang-Gyun Woo, Yongin-si (KR);
Jeong-Lim Nam, Yongin-si (KR);
Kyeong-Koo Chi, Seoul (KR);
Seok-Hwan Oh, Suwon-si (KR);
Gi-Sung Yeo, Seoul (KR); Seung-Pil Chung, Seoul (KR); Heung-Sik Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 417 days.

(21) Appl. No.: 11/429,071

(22) Filed: May 8, 2006

(65) Prior Publication Data

US 2007/0020565 A1    Jan. 25, 2007

(30) Foreign Application Priority Data

Jul. 25, 2005    (KR)    ...................... 10-2005-0067292

(51) Int. Cl.
*C03C 15/00*    (2006.01)
(52) U.S. Cl. .......................... 216/41; 216/37; 216/461; 438/128; 438/129; 438/118; 438/280; 438/316; 438/585; 438/618; 257/208; 257/211; 257/758; 257/775; 257/776
(58) Field of Classification Search ................ 216/41; 438/618; 257/208
See application file for complete search history.

(56) References Cited

U.S. PATENT DOCUMENTS

2005/0277276 A1* 12/2005 Stephens et al. ............ 438/585

FOREIGN PATENT DOCUMENTS

| JP | 11-329939 | 11/1999 |
|---|---|---|
| KR | 100223325 B1 | 7/1999 |
| KR | 1020010004612 A | 1/2001 |

* cited by examiner

*Primary Examiner*—Nadine Norton
*Assistant Examiner*—Maki Angadi
(74) *Attorney, Agent, or Firm*—Harness, Dickey & Pierce, P.L.C.

(57) ABSTRACT

Methods of fabricating a semiconductor device are provided. Methods of forming a finer pattern of a semiconductor device using a buffer layer for retarding, or preventing, bridge formation between patterns in the formation of a finer pattern below resolution limits of a photolithography process by double patterning are also provided. A first hard mask layer and/or a second hard mask layer may be formed on a layer of a substrate to be etched. A first etch mask pattern of a first pitch may be formed on the second hard mask layer. After a buffer layer is formed on the overall surface of the substrate, a second etch mask pattern of a second pitch may be formed thereon in a region between the first etch mask pattern. The buffer layer may be anisotropically etched using the second etch mask pattern as an etch mask, forming a buffer layer pattern. The second hard mask layer may be anisotropically etched using the first etch mask pattern and/or the buffer layer pattern as etch masks, forming a second hard mask pattern. The first hard mask layer may be anisotropically etched using the second hard mask pattern as an etch mask, forming a first hard mask pattern. The etched layer may be anisotropically etched using the first hard mask pattern as an etch mask.

23 Claims, 13 Drawing Sheets

METHODS OF FABRICATING A SEMICONDUCTOR DEVICE

PRIORITY STATEMENT

This application claims benefit of priority under 35 USC § 119 from Korean Patent Application No. 10-2005-0067292, filed on Jul. 25, 2005, in the Korean Intellectual Property Office, the contents of which are incorporated herein by reference in its entirety.

BACKGROUND OF THE INVENTION

1. Field of the Invention

Example embodiments of the present invention relates to methods of fabricating a semiconductor device. Other example embodiments relate to methods of forming a finer pattern of a semiconductor device using a double patterning technique.

2. Description of the Related Art

Miniaturization of a pattern in semiconductor fabrication may be necessary for higher integration of a semiconductor device. In order to integrate more elements in a narrower area, the size of a discrete element may be reduced. Pitch, which is the sum of a width and a distance of a desired pattern, may be reduced. With a design rule of a device decreasing resolution of a photolithography process, which may be used to form the pattern of a semiconductor device capable of meeting certain requirements, may be limited. Example requirements may include a desired line and space pattern (hereinafter referred to as "L/S pattern"). The formation of a pattern having a finer pitch may also be limited.

Various pattern formation techniques have been proposed in order to overcome the resolution limitation of the photolithography process. Conventional methods include a pattern formation technique using two sheets of photomasks. FIGS. 1A through 1G are sectional views illustrating a conventional method of forming a finer pattern of a semiconductor device using two sheets of photomasks.

Referring to FIG. 1A, a material layer 12 to be etched, a first mask material layer 14, a second mask material layer 16 and/or a first photoresist layer 18 may be sequentially formed on a substrate 10. A light beam 11 may be irradiated on the first photoresist layer 18 through a first exposure mask 20 formed of a first transparent substrate 22 having a first light shield layer pattern 24.

Referring to FIG. 1B, the first photoresist layer 18 may be developed to form a first photoresist pattern 18A. Using the first photoresist pattern 18A as an etch mask, the second mask material layer 16 may be etched so as to form a second mask material layer pattern 16A.

Referring to FIG. 1C, a second photoresist layer 26 may be formed on the resultant structure having the first photoresist pattern 18A and the second mask material layer pattern 16A. A light beam 11 may be irradiated on the second photoresist layer 26 through a second exposure mask 30 formed of a second transparent substrate 32 having a second light shield layer pattern 34. The second light shield layer pattern 34 of the second exposure mask 30 may be formed not to overlap the first light shield pattern 24 of the first exposure mask 20 and/or may be disposed in the middle portion between the first light shield pattern 24.

Referring to FIG. 1D, the second photoresist layer 26 may be developed to form a second photoresist pattern 26A. Using the second photoresist pattern 26A and the second mask material layer pattern 16A as etch masks, the first mask material layer 14 may be etched to form a first mask material layer pattern 14A.

Referring to FIG. 1E, the material layer 12 may be anisotropically etched using the first mask material layer pattern 14A, the second mask material layer pattern 16A and/or the second photoresist pattern 26A as etch masks to form a material layer pattern 12A. The second mask material layer pattern 16A may be removed concurrently with the etching. A remnant layer 26B of the second photoresist pattern 26A may remain on the first mask material layer pattern 14A.

Referring to FIG. 1G, the first mask material layer pattern 14A and/or the remnant layer 26B, which may remain on the material layer pattern 12A, may be removed.

The conventional method of forming a pattern as described above is limited in the formation of a finer pattern of about 40 nm or less. The second photoresist pattern 26A may be formed between the second mask material layer pattern 16A in the conventional pattern formation method. When the distance between the second mask material layer pattern 16A and the second photoresist pattern 26A is narrow, a bridge may form between the second mask material layer pattern 16A and the second photoresist pattern 26A during the formation of the second photoresist pattern 26A. Developer solution may not sufficiently penetrate into a bottom portion during the formation of the second photoresist pattern 26A because the distance between the second mask material layer pattern 16A and the second photoresist pattern 26A becomes narrower. Further, it may be necessary to control critical dimension (CD) uniformity in the fabrication of a finer pattern of 40 nm or less. It may be necessary to employ a separate organic anti-reflective coating (ARC) layer during the formation of the second photoresist pattern 26A in the conventional double patterning technology as described above in order to increase CD uniformity. However, bridges may form if the organic ARC inside a narrow space between the second mask material layer pattern 16A and the second photoresist pattern 26A is not sufficiently removed.

When coating the resultant structure having the second mask material layer pattern 16A with a photoresist material in order to form the second photoresist pattern 26A, the photoresist material may not uniformly spread due to remnant materials such as a bridge existing between the second mask material layer pattern 16A. It may be difficult to control pattern fidelity during the fabrication of a finer pattern.

FIG. 2 is a photograph illustrating a photoresist material after coating in the conventional method of forming a finer pattern. FIG. 2 is a photograph illustrating the formation of a section of the second mask material layer pattern 16A. The second mask material layer pattern 16A may be coated with a photoresist material for the formation of the second photoresist pattern 26A.

As shown in FIG. 2, the coated photoresist material may not uniformly spread due to remnant materials between the second mask material layer pattern 16A.

In the double patterning process, it may be desirous to control the formation of defects. The hard mask may remain on the substrate after the first patterning process. For example, the first mask material layer 14 in FIG. 1B may be partially damaged during the etch process causing a pitting phenomenon. The layers under the first mask layer 14 may be removed through the broken hard mask to generate an empty space.

FIGS. 3A and 3B are photographs illustrating that a pitting phenomenon is generated in the conventional method of forming a finer pattern; and FIG. 4 is a photograph illustrating a protrusion phenomenon caused by pitting in the conventional method of forming a finer pattern.

FIGS. 3A and 3B are photographs of an upper surface and a section of a substrate illustrating a pitting phenomenon which may occur on the substrate after the first patterning process is performed.

As a bottom photoresist layer is formed on a substrate by coating under conditions favorable for the generation of the pitting phenomenon, as shown in FIGS. 3A and 3B, and then baked by a bake process, a protrusion phenomenon may occur as shown in FIG. 4. If a photoresist pattern is formed thereon, defocusing and/or a pattern bridge phenomenon may occur.

The conventional art acknowledges a technique of patterning an etched layer using a spacer pattern, formed by a spacer having a smaller size, as a hard mask. However, when using a spacer pattern as a hard mask, a pair of spacers disposed to the right and/or left of a central pattern may not have a uniform thickness. Spacers may be formed to have a larger thickness than a desired thickness in order to make the thickness of the right and/or left spacers more uniform. After the spacers are used as a hard mask, the spacers may not be sufficiently removed. Further, the hard mask having the spacer shape may be shaped to surround the pattern disposed at the center. Therefore, in the case of fabricating a line pattern using the spacer, a separate trimming process may be necessary to separate the spacer into a discrete line pattern.

SUMMARY OF THE INVENTION

Example embodiments of the present invention relate to methods of fabricating a semiconductor device. Other example embodiments relate to methods of forming a finer pattern of a semiconductor device using a double patterning technique.

Example embodiments of the present invention provide a method of forming a finer pattern of a semiconductor device for retarding, or preventing, the occurrence of pattern failures due to a bridge or a pitting phenomenon between adjacent patterns by overcoming the resolution limit of a photolithography process in fabricating a finer pattern of a pitch of about 40 nm or less, and for increasing pattern fidelity and/or a CD uniformity.

According to an example embodiment of the present invention, there is provided a method of forming a finer pattern of a semiconductor device including forming a first hard mask layer on an etched layer on a substrate. A second hard mask layer may be formed on the first hard mask layer. A first etch mask pattern may be formed on the second hard mask layer. The first etch mask pattern may be repeatedly formed with a first pitch. A buffer layer may be formed on the overall surface of the resultant structure having the first etch mask pattern. A second etch mask pattern may be formed on the buffer layer using a photolithography process. The second etch mask pattern may be repeatedly formed with the first pitch between the first etch mask pattern. The buffer layer may be anisotropically etched using the second etch mask pattern as an etch mask, forming a buffer layer pattern. The second hard mask layer may be anisotropically etched using the first etch mask pattern and/or the buffer layer pattern as etch masks, forming a second hard mask pattern. The first hard mask layer may be anisotropically etched using the second hard mask pattern as an etch mask, forming a first hard mask pattern being repeatedly formed with a second pitch about ½ the first pitch. The etched layer may be anisotropically etched using the first hard mask pattern as an etch mask.

The second hard mask layer may be formed of a material having different etch characteristics from the first hard mask layer. The second hard mask layer may be formed of a single layer selected from the group consisting of an oxide layer, a nitride layer, an oxynitride layer, a polysilicon layer and/or a composite layer of a polysilicon layer.

The process of forming the first etch mask pattern may include forming a third hard mask layer on the second hard mask layer, forming a first photoresist pattern by the first pitch on the third hard mask layer and/or anisotropically etching the third hard mask layer using the first photoresist pattern as an etch mask, forming a third hard mask pattern. The third hard mask layer may be formed of a material having different etch characteristics from the second hard mask layer. The third hard mask may be formed of a single layer selected from the group consisting of an oxide layer, a nitride layer, an oxynitride layer, a polysilicon layer and/or a composite of a polysilicon layer.

The process of forming the first etch mask pattern may include forming a first photoresist pattern by the first pitch on the second hard mask layer and/or partially etching the second hard mask layer by a desired thickness of a total thickness using the first photoresist pattern as an etch mask, forming a protrusion portion under the first photoresist pattern.

Before forming the buffer layer, the method may include forming a capping layer on the surface of the resultant structure having the first etch mask pattern. The capping layer may be formed of an amorphous carbon layer (ACL), an organic anti-reflective coating (ARC) layer, lower viscosity polymer, an oxide layer and/or an oxynitride layer.

The process of forming the capping layer may include forming a capping material layer on the surface of the resultant structure having the first etch mask pattern and/or performing multi-steps of thermal treatment on the capping material layer. The multi-steps of thermal treatment may include a soft bake process of thermally processing at a first temperature and/or a hard bake process of thermally processing at a second temperature higher than the first temperature after the soft bake process.

The buffer layer may be formed of bottom resist material by a bi-layer resist (BLR) process. The second etch mask pattern may be formed of photoresist pattern containing silicon (Si).

The process of forming the buffer layer may include coating an overall surface of the resultant structure having the first etch mask pattern with the bottom resist material and/or baking the coated bottom resist material by a hard bake process.

Before forming the second etch mask pattern, the method may include forming a fourth hard mask layer on the buffer layer and/or anisotropically etching the fourth hard mask layer using the second etch mask pattern as an etch mask, forming a fourth hard mask pattern. The fourth hard mask layer may be formed of a material having different etch characteristics from the material of the buffer layer.

According to example embodiments of the present invention, the occurrence of pattern failures due to a bridge phenomenon and/or a pitting phenomenon between adjacent patterns may be retarded, or prevented, by overcoming the resolution limit of a photolithography process during the fabrication of a finer pattern of a pitch of about 40 nm or less. Furthermore, pattern fidelity and/or CD uniformity may increase.

BRIEF DESCRIPTION OF THE DRAWINGS

Example embodiments of the present invention will become readily apparent by reference to the following detailed description when considering in conjunction with the accompanying drawings. FIGS. 1-8 represent non-limiting example embodiments of the present invention as described herein.

FIG. 2 is a photograph illustrating a photoresist material after coating in the conventional method of forming a finer pattern;

FIG. 4 is a photograph illustrating a protrusion phenomenon caused by pitting in the conventional method of forming a finer pattern;

DETAILED DESCRIPTION OF EXAMPLE EMBODIMENTS

Figure 1A:
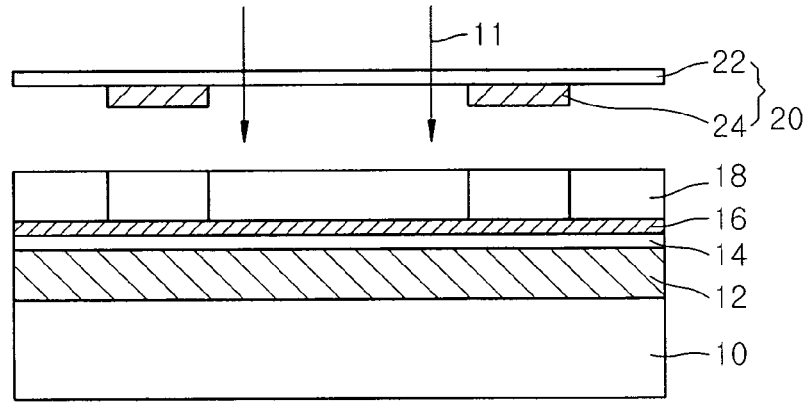
FIGS. 1A through 1G are sectional views illustrating a conventional method of forming a finer pattern of a semiconductor device using two sheets of photomasks in accordance with processing sequences.
Figure 1B:
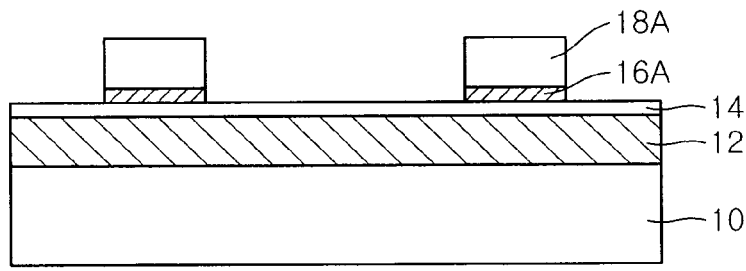
Figure 1C:
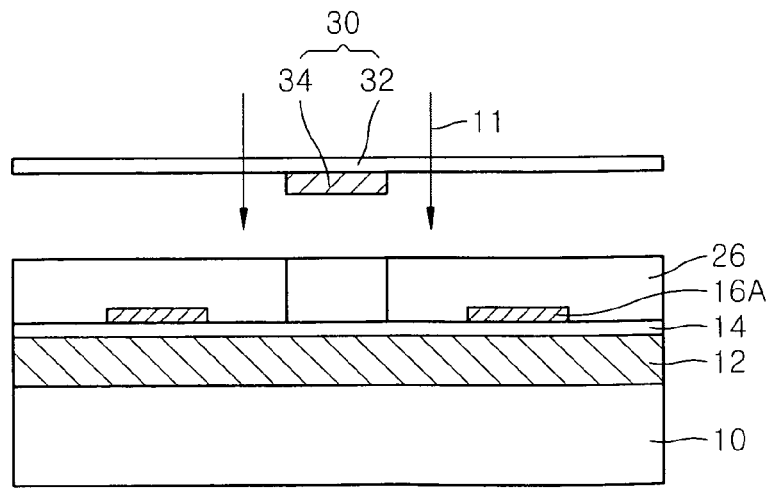
Figure 1D:
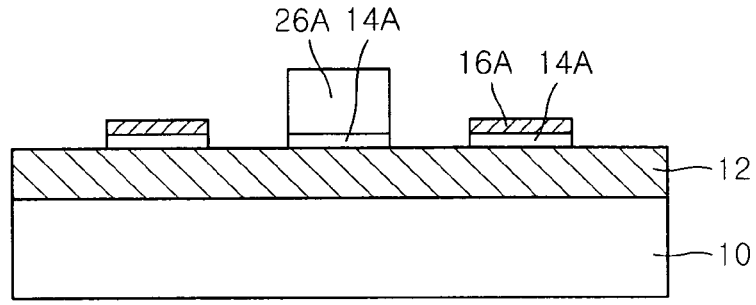
Figure 1E:
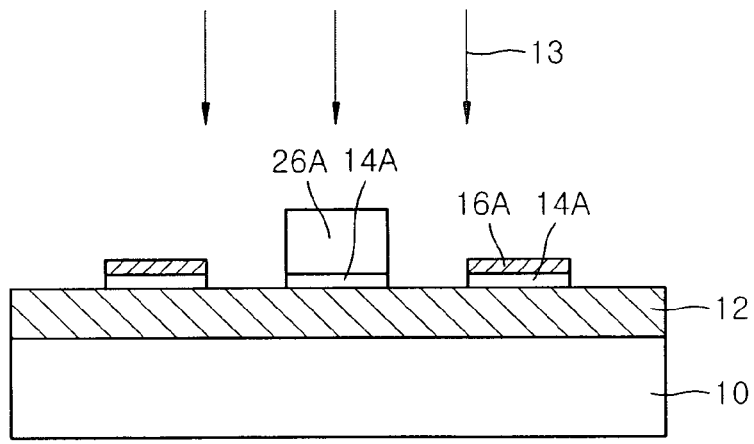
Figure 1F:
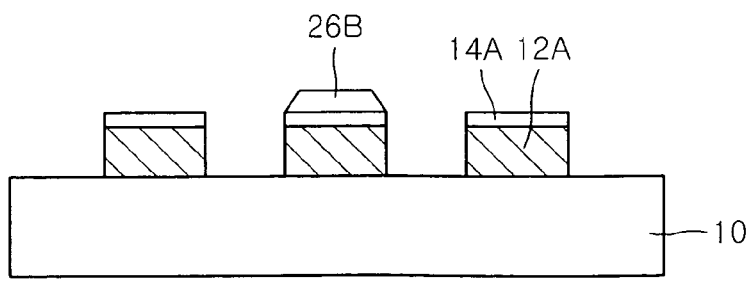
Figure 1G:
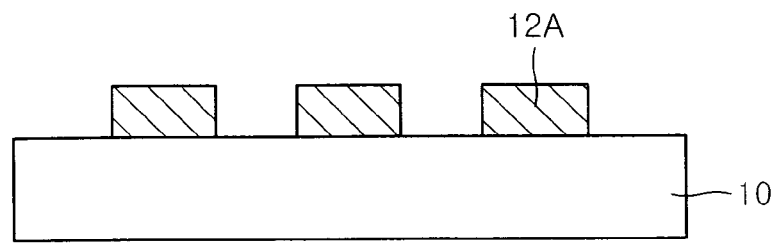
Figure 2:
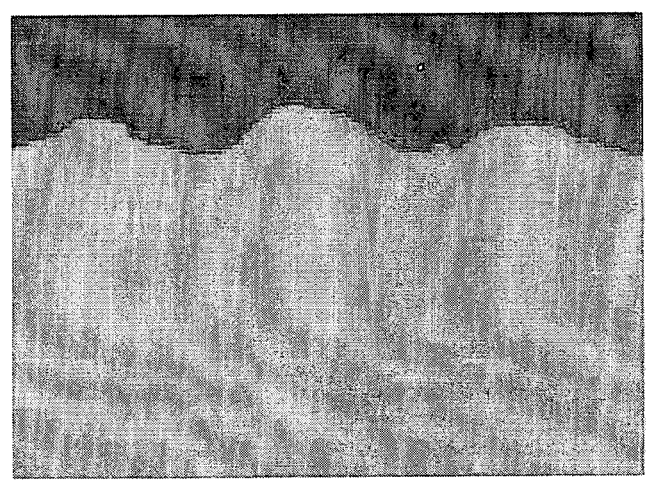
Figure 3A:
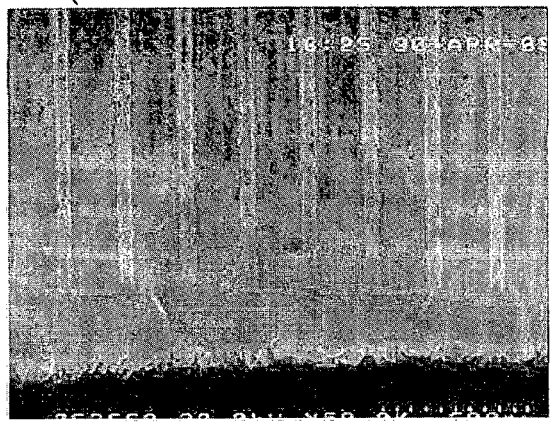
FIGS. 3A and 3B are photographs illustrating that a pitting phenomenon is generated in the conventional method of forming a finer pattern.
Figure 3B:
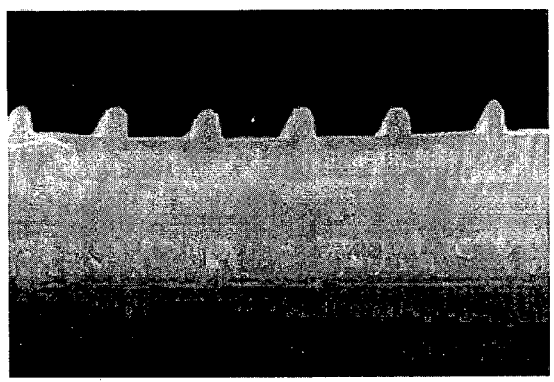
Figure 4:
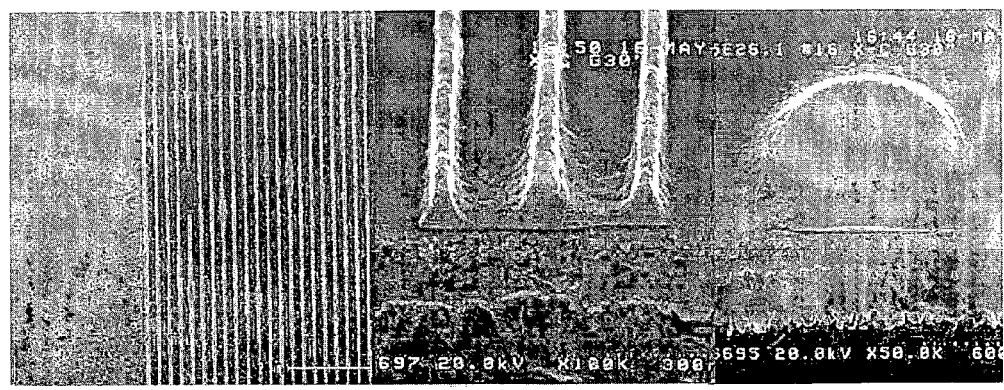

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Also, the use of the words "compound," "compounds," or "compound(s)," refer to either a single compound or to a plurality of compounds. These words are used to denote one or more compounds but may also just indicate a single compound.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described.

Example embodiments of the present invention relate to a method of fabricating a semiconductor device. Other example embodiments relate to methods of forming a finer pattern of a semiconductor device using a double patterning technique.

Example embodiments of the present invention provide methods of forming a finer pattern by performing a double patterning process using a novel bi-layer resist (BLR) process or multi-layer resist (MLR) process employing a capping process.

Hereinafter, methods of forming a finer pattern of a semiconductor device according to example embodiments of the present invention will be described.

FIGS. 5A through 5G are sectional views illustrating a method of forming a finer pattern of a semiconductor device according to an example embodiment of the present invention in accordance with processing sequences.

According to an example embodiment, a process of performing a double patterning process using a BLR process will be described. Herein, a bottom resist used in the BLR process may be used as a buffer layer disposed between adjacent patterns in order to retard, or prevent, the formation of bridges between adjacent patterns.

Figure 5A:
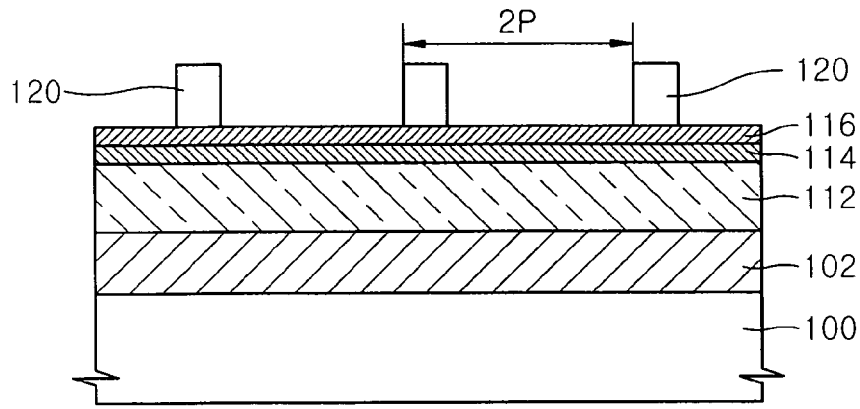
FIGS. 5A through 5G are sectional views illustrating a method of forming a finer pattern of a semiconductor device according to an example embodiment of the present invention.

Referring to FIG. 5A, a first hard mask layer 112, a second hard mask layer 114 and/or a third hard mask layer 116 may be sequentially formed on a semiconductor substrate 100 having a layer 102 to be etched.

The layer 102 may be formed of various materials in accordance with usage of the pattern to be formed. For example, the layer 102 may be formed of silicon in the case of defining an active region. The layer 102 may be formed of a conductive layer (e.g., doped polysilicon) or a stack structure including doped polysilicon and/or a metal silicide layer in the case of forming a gate electrode. The layer 102 may be formed of metal, (e.g., tungsten or aluminum) in the case of forming a bit line.

The first hard mask layer 112, the second hard mask layer 114 and/or the third hard mask layer 116 may be formed of materials having different etch characteristics, such as materials having different etch selectivities with respect to a given etchant or etch gas. For example, the first hard mask layer 112 may be formed of an amorphous carbon layer (ACL) with a thickness of about 2000 Å. The second hard mask layer 114 and/or the third hard mask layer 116 may be formed with a thickness of about 300 Å-1500 Å. The second hard mask layer 114 and/or the third hard mask layer 116 may be formed of an oxide layer, a nitride layer, an oxynitride layer and/or a polysilicon layer. For example, the second hard mask layer 114 may be formed of an oxide layer with a thickness of about 600 Å (e.g., a plasma enhanced tetraethylorthosilicate (P-TEOS) layer). The third hard mask layer 116 may be formed of a nitride layer with a thickness of about 600 Å (e.g., a SiON layer). However, the component materials of the first hard mask layer 112, the second hard mask layer 114 and/or the third hard mask layer 116 are not limited to the materials set forth as above. The first hard mask layer 112, the second hard mask layer 114 and/or the third hard mask layer 116 may be formed of various materials under the condition that different etch characteristics are provided with the respective materials. The second hard mask layer 114 may be formed of at least one layer selected from the group consisting of a thermal oxide layer, a chemical vapor deposition (CVD) oxide layer, an un-doped silicate glass (USG) layer and/or a higher density plasma (HDP) oxide layer. The third hard mask layer 116 may be formed of at least one layer selected from the group consisting of SiON, SiN, SiBN and/or BN.

An organic anti-reflective coating (ARC) layer (not shown) may be formed on the third hard mask layer 116. A first photoresist pattern 120 may be formed on the third hard mask layer 116. The organic ARC layer may be omitted. The first photoresist layer 120 may be formed to have a pitch 2P about two times the pitch of a first pitch P of the pattern to be formed.

Figure 5B:
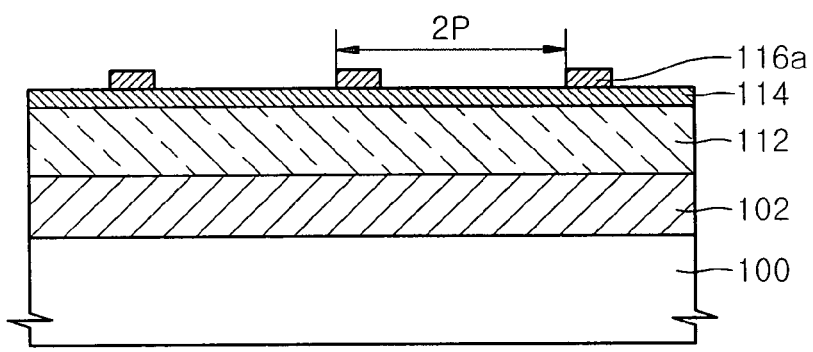

Referring to FIG. 5B, the third hard mask layer 116 may be anisotropically etched using the first photoresist pattern 120 as an etch mask, forming a third hard mask pattern 116a. The third hard mask pattern 116a may be formed with a second pitch 2P. The organic ARC layer and/or the first photoresist pattern 120 may be removed.

Figure 5C:
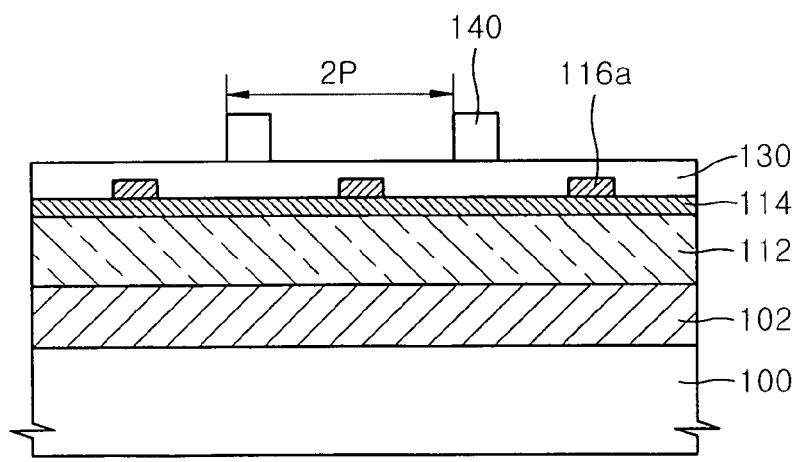

Referring to FIG. 5C, the third hard mask pattern 116a may be coated with bottom resist having a thickness sufficient to remove the height difference created by the third hard mask pattern 116a. The bottom resist may be coated to a thickness of about 700 Å-1700 Å. A hard bake may be performed to bake the coated bottom resist, forming a bottom resist layer 130. For example, the hard bake may be performed at a temperature of about 270° C. for approximately 100 seconds. Before forming the bottom resist layer 130, an organic ARC layer (not shown) may be formed.

The bottom resist layer 130 may be coated with a top resist with a thickness of about 1300 Å. Exposure and/or development processes may be performed, forming a second photoresist pattern 140. The second photoresist pattern 140 may be formed using a resist composition material achieved from a Si-containing polymer. The second photoresist pattern 140 may be formed in a region between the third hard mask pattern 116a. The second photoresist pattern 140 may be formed to have the second pitch 2P two times the pitch of the first pitch P of the pattern to be formed, similar to the first photoresist pattern 120. The bottom resist layer 130 may function as a buffer layer to retard a bridge phenomenon. The bridge phenomenon may occur between the third hard mask pattern 116a and the second photoresist pattern 140.

Figure 5D:
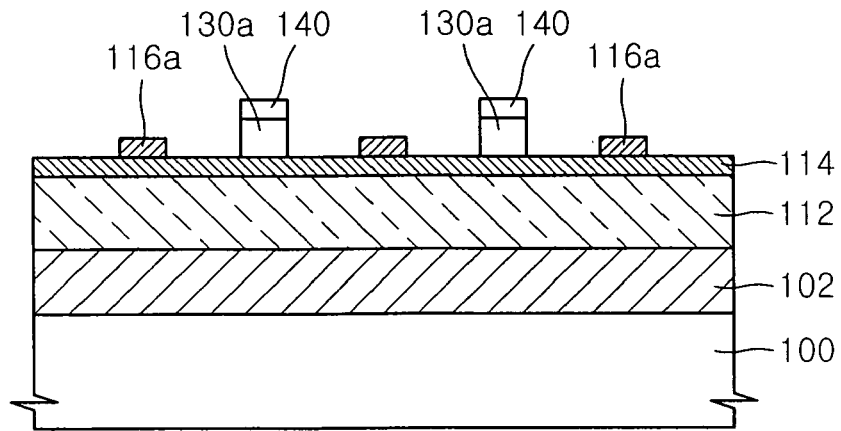

Referring to FIG. 5D, the bottom resist layer 130 may be anisotropically etched using the second photoresist pattern 140 as an etch mask, forming a bottom resist pattern 130a. After etching, a portion of the second photoresist layer 140 may remain on the bottom resist pattern 130a, which may be partially consumed.

Figure 5E:
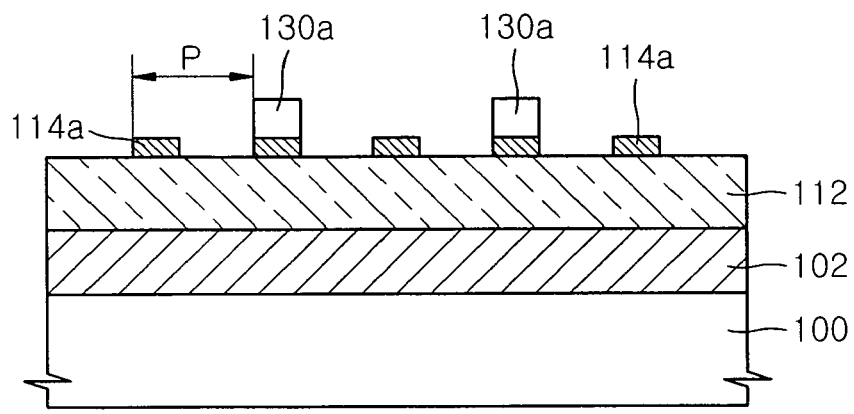

Referring to FIG. 5E, the second hard mask layer 114 may be anisotropically etched using the third hard mask pattern 116a and/or the bottom resist pattern 130a as etch masks, forming a second hard mask pattern 114a. During the etching process, the third hard mask pattern 116a and/or the bottom resist pattern 130a on the second hard mask pattern 114a may be partially, or entirely, etched. The second hard mask pattern 114a may be formed to have the same pitch as the first pitch P to be formed on the semiconductor substrate 100. The first pitch P may be formed by the patterning of the layer 102.

Figure 5F:
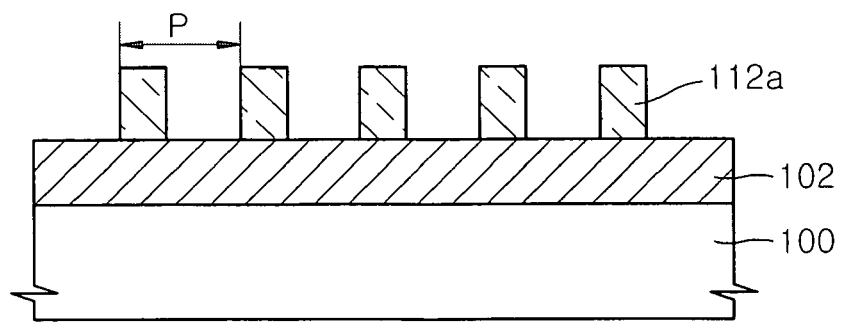

Referring to FIG. 5F, the first hard mask layer 112 may be anisotropically etched using the second hard mask pattern 114a as an etch mask, forming the first hard mask pattern 112a. The first hard mask pattern 112a may be formed with the first pitch P. During the etching process, the second hard mask pattern 114a on the first hard mask pattern 112a may be partially, or entirely, etched.

Figure 5G:
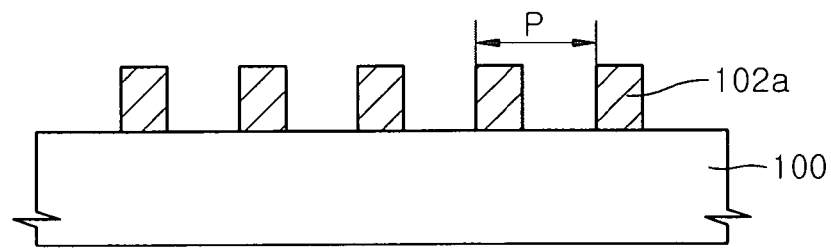

Referring to FIG. 5G, the layer 102 may be anisotropically etched using the first hard mask pattern 112a as an etch mask, forming a pattern 102a. The first hard mask pattern 112a, which may remain on the pattern 102a, may be removed. The pattern 102a may be formed on the semiconductor substrate 100 to have the first pitch P.

In the example embodiment as described in reference to FIGS. 5A through 5G, the bottom resist layer 130 may be used as a buffer layer in order to retard, or prevent, the formation of a bridge. The bridge may form between the third hard mask pattern 116a and the second photoresist pattern 140. When forming a pattern having a pitch about ½ the minimum pitch, the possibility of bridge formation between adjacent patterns may be reduced by patterning using a conventional exposure apparatus.

FIGS. 6A through 6H are sectional views illustrating a method of forming a finer pattern of a semiconductor device according to an example embodiment of the present invention.

A process of performing a double patterning process using a BLR process in accordance with example embodiments of the present invention will be explained. The bottom resist, which may be used in a BLR process in order to retard bridge formation between adjacent patterns, may be used as a buffer layer disposed between adjacent patterns. A capping layer may be used on a hard mask layer in order to retard, or prevent, a pitting phenomenon. The capping layer may also protect the hard mask layer.

Figure 6A:
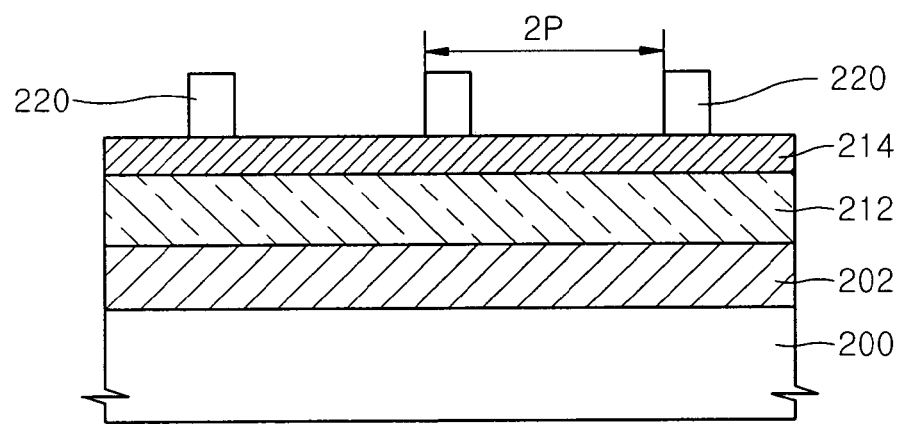
FIGS. 6A through 6H are sectional views illustrating a method of forming a finer pattern of a semiconductor device according to an example embodiment of the present invention.

Referring to FIG. 6A, a first hard mask layer 212 and/or a second hard mask layer 214 may be sequentially formed on a semiconductor substrate 200 having a layer 202 to be etched.

The layer 202 may be formed of the same material as described in reference to FIG. 5A. The first hard mask layer 212 and/or the second hard mask layer 214 may be formed of materials having different etch characteristics. The materials may have different etch selectivities with respect to a given etchant or etch gas. For example, the first hard mask layer 212 may be formed of an ACL layer with a thickness of about 2000 Å. The second hard mask layer 214 may be formed with a thickness of about 300 Å-1500 Å. The second hard mask layer 214 may be formed of a SiON layer.

An organic ARC layer (not shown) may be formed on the second hard mask layer 214. A first photoresist pattern 220 may be formed on the organic ARC layer. The organic ARC layer may be omitted. The first photoresist layer 220 may be formed to have a pitch 2P two times the pitch of a first pitch P of the pattern to be formed.

Figure 6B:
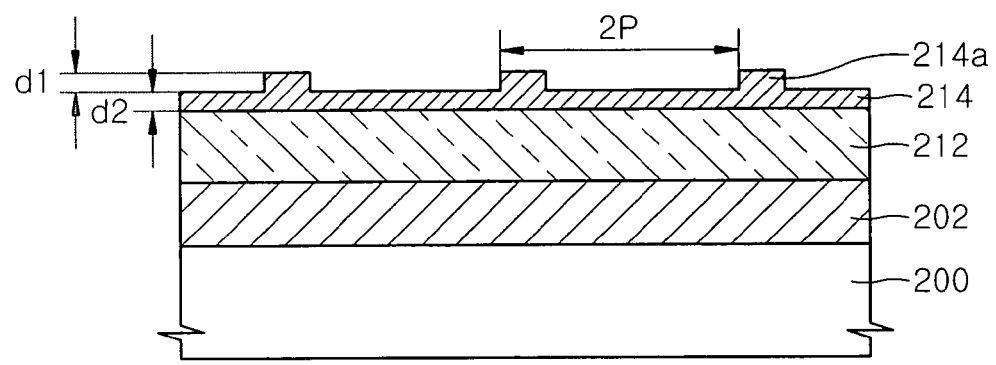

Referring to FIG. 6B, the second hard mask layer 214 may be partially removed as much as a thickness d1 of the total thickness from its upper surface using the first photoresist pattern 220 as an etch mask in order that portions of the second hard mask layer 214 on the first hard mask layer 212 around the first photoresist pattern 220 may partially remain as much as a thickness d2. A protrusion portion 214a may be formed on the second hard mask layer 214 at the position under the first photoresist pattern 220. For example, a thickness of about 300 Å-1500 Å may be removed from an upper surface of the second hard mask layer 214 in order that the second hard mask layer 214 may remain on the first hard mask layer 212 having a thickness of about 100 Å-400 Å.

The organic ARC layer and/or the first photoresist pattern 220 may be removed.

Figure 6C:
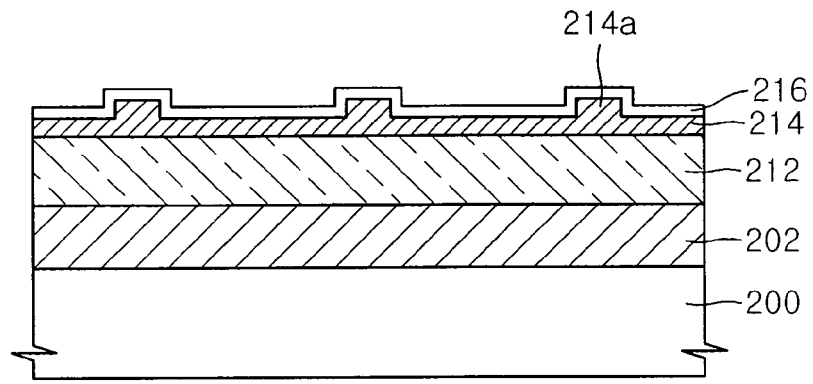

Referring to FIG. 6C, a capping layer 216 may be formed to substantially cover the upper surface of the second hard mask layer 214 including the protrusion portion 214a. The capping layer 216 protects the second hard mask layer 214 to prevent a pitting phenomenon under the second hard mask layer 214. For example, the capping layer 216 may be formed of, an ACL or polymer having a lower viscosity (e.g., an organic ARC layer, an oxide layer or a SiON layer). The capping layer 216 may be formed with a thickness of about 50 Å-1000 Å (e.g., about 200 Å-500 Å).

When the capping layer 216 is formed of a lower viscosity polymer, the lower viscosity polymer may be coated on the second hard mask layer 214 with a desired thickness, e.g., about 300 Å. Multiple thermal treatments may be performed. For the multiple thermal treatments, the lower viscosity polymer may be soft-baked at a temperature of about 90° C. for approximately 60 seconds and/or hard-baked at a temperature of about 200° C. for approximately 90 seconds.

Figure 6D:
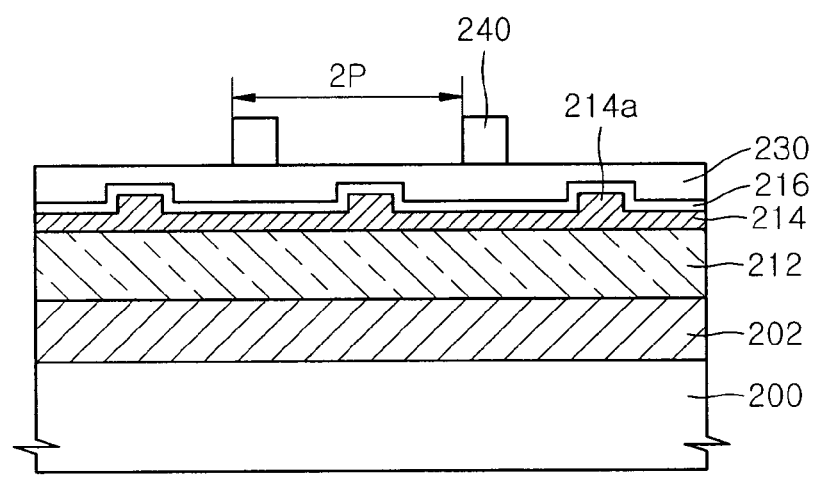

Referring to FIG. 6D, the capping layer 216 may be coated with a bottom resist having a thickness enough to remove the height difference formed on the capping layer 216 by the protrusion portion 214a. In order to form the bottom resist layer 230, a hard bake process may be performed at a temperature of about 270° C. for approximately 100 seconds in order to bake the bottom resist. The bottom resist may be coated with a thickness of about 700 Å-1700 Å. Before the bottom resist layer 230 is formed, an organic ARC layer (not shown) may be formed.

The bottom resist layer 230 may be coated with top resist having a thickness of about 1300 Å. Exposure and/or development processes may be performed, forming a second photoresist pattern 240. The second photoresist pattern 240 may be formed using resist composition material achieved from a silicon-containing polymer. The second photoresist pattern 240 may be formed in a region between the first photoresist patterns 220. The second photoresist pattern 240 may be formed to have a second pitch 2P two times the pitch P of the pattern to be formed, similar to the first photoresist pattern 220. The bottom resist layer 230 functions as a buffer layer to retard, or prevent, a bridge phenomenon. The bridge phenomenon may occur between the protrusion portion 214a of the second hard mask layer 214 and the second photoresist pattern 240.

Figure 6E:
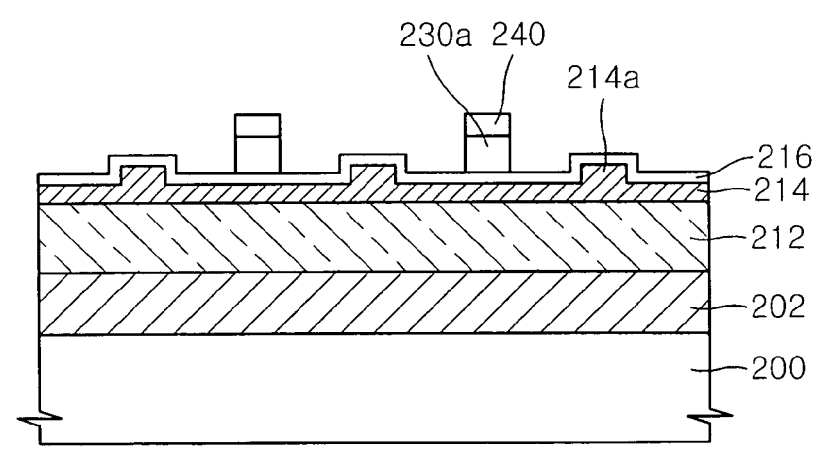

Referring to FIG. 6E, the bottom resist layer 230 may be anisotropically etched using the second photoresist pattern 240 as an etch mask, forming a bottom resist pattern 230a.

After the etch process, the second photoresist pattern 240 may be partially etched and a portion thereof may remain on the bottom resist pattern 230a.

Figure 6F:
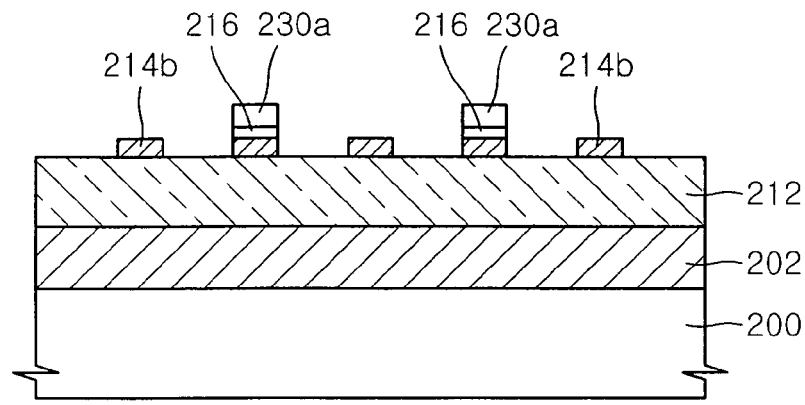

Referring to FIG. 6F, using the protrusion portion 214a of the second hard mask layer 214 and/or the bottom resist pattern 230a as etch masks, a relatively thin portion of the second hard mask layer 214 between may be partially, or completely, removed. As a result, a second hard mask pattern 214b as a result of using the bottom resist pattern 230a and the second hard mask layer 214 as etching masks partially consumed by the etch process may remain on the first hard mask layer 212. If the capping layer 216 is formed of a material having similar etch characteristics than the etch characteristics of the second hard mask layer 214, performing additional etch processes to remove the capping layer 216 covering the first hard mask layer 214 may not be necessary. If the capping layer 216 is formed of a material having different etch characteristics than the etch characteristics of the second hard mask layer 214, performing an additional etch process to remove the capping layer 216 before removing the relatively thin portion of the second hard mask layer 214 may be necessary.

Figure 6G:
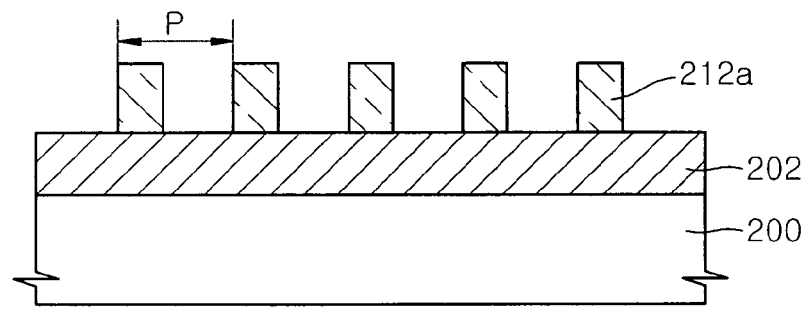

Referring to FIG. 6G, the first hard mask layer 212 may be anisotropically etched using the bottom resist pattern 230a and the second hard mask pattern 214b as etch masks, forming a first hard mask pattern 212a. The first hard mask pattern 212a may be formed having the first pitch P. During the etch process, the second hard mask pattern 214b and the bottom resist pattern 230a on the first hard mask pattern 212a may be partially, or entirely, etched.

Figure 6H:
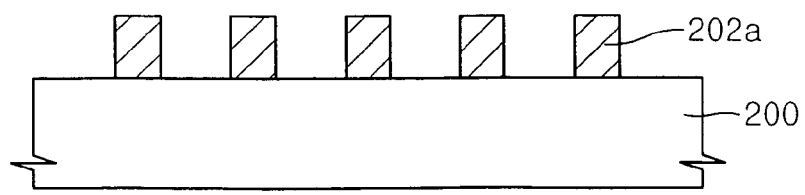

Referring to FIG. 6H, the layer 202 may be anisotropically etched using the first hard mask pattern 212a as an etch mask, forming a pattern 202a. The first hard mask pattern 212a, which may remain on the pattern 202a, may be removed. The pattern 202a may be formed on the semiconductor substrate 200 with the first pitch P.

According to other example embodiments explained in reference to FIGS. 6A-6G, the bottom resist layer 230 may be used as a buffer layer to prevent the formation of bridges between the protrusion portion 214a of the second hard mask layer 214 and the second photoresist pattern 240. The possibility of bridge formation between adjacent patterns may be reduced in the case of forming a finer pattern having a pitch approximately ½ the minimum pitch achieved by patterning using a conventional exposure apparatus. Further, as the capping layer 216 may be formed on the second hard mask layer 214 to control pitting, the occurrence of defects on the semiconductor substrate 200 may be reduced.

FIGS. 7A through 7G are sectional views illustrating a method of forming a finer pattern of a semiconductor device according to an example embodiment of the present invention.

According to example embodiments of the present invention, a buffer layer may be used to retard, or prevent, bridge formation between adjacent patterns. The buffer layer may be formed of a bottom resist used in an MLR process or ACL. A hard mask layer may be formed on the buffer layer. Further, a capping layer to protect the hard mask layer may be formed thereon in order to reduce, or prevent, a pitting phenomenon. In FIGS. 7A-7G, like numerals in FIGS. 5A-5G refer to like elements, and detailed description thereof will be omitted.

Figure 7A:
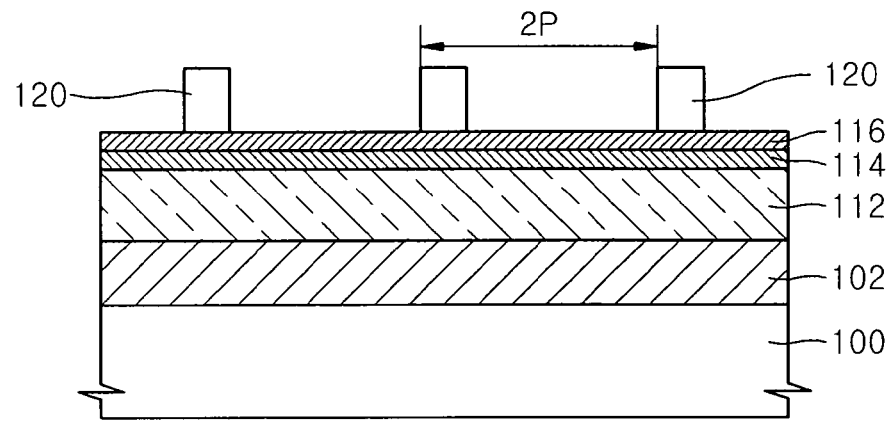
FIGS. 7A through 7G are sectional views illustrating a method of forming a finer pattern of a semiconductor device according to an example embodiment of the present invention.

Referring to FIG. 7A, a first hard mask layer 112, a second hard mask layer 114 and/or a third hard mask layer 116 may be sequentially formed on a semiconductor substrate 100 having a layer 102 to be etched formed thereon as described in reference to FIG. 5A. A first photoresist pattern 120 may be formed on the third hard mask pattern 116.

Figure 7B:
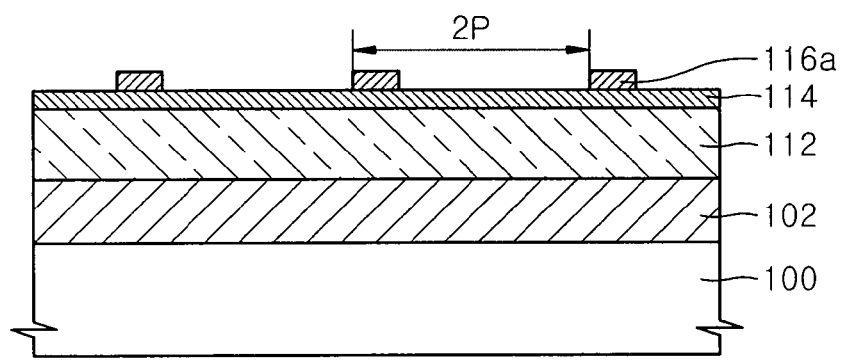

Referring to FIG. 7B, the third hard mask layer 116 may be anisotropically etched, forming a third hard mask pattern 116a as described in reference to FIG. 5B. The organic ARC layer and/or the first photoresist pattern 120 may be removed.

Figure 7C:
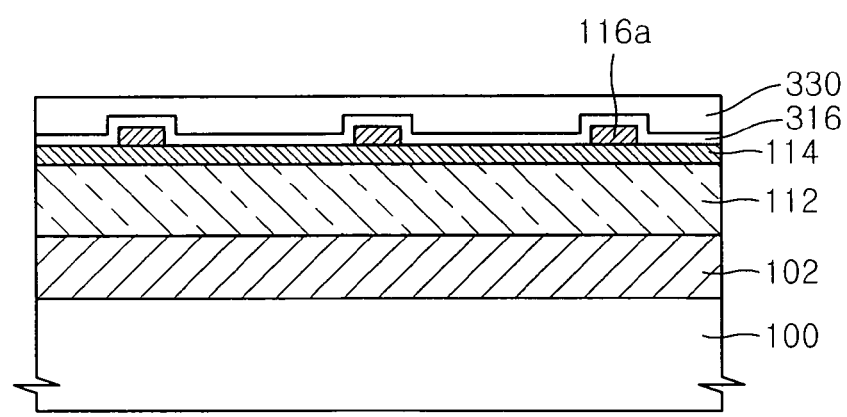

Referring to FIG. 7C, a capping layer 316 may be formed on the third hard mask pattern 116a as described in reference to FIG. 6C. The capping layer 316 may be omitted.

A buffer layer 330 may be formed on the capping layer 316. The buffer layer 330 may have a thickness enough to remove the height difference between the third hard mask pattern 116a and the capping layer 316 on the semiconductor substrate 100. The buffer layer 330 may be formed of an ACL or bottom resist material. If the buffer layer 330 is formed of an ACL, the ACL may be deposited on the capping layer 316 with a thickness of about 1000 Å-3000 Å. An upper surface of the buffer layer 330 may be planarized by a chemical mechanical polishing (CMP) process, if necessary. If the buffer layer 330 is composed of a bottom resist material, the capping layer 316 may be coated with the bottom resist material with a thickness of about 1000 Å-3000 Å. The bottom resist material may be hardened by hard baking. For example, the hard bake may be performed at a temperature of about 270° C. for approximately 100 seconds.

Figure 7D:
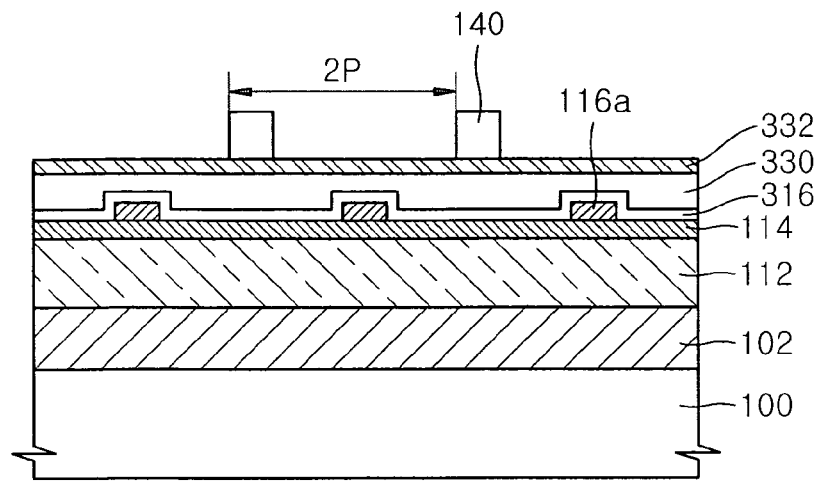

Referring to FIG. 7D, a fourth hard mask layer 332 may be formed on the buffer layer 330. The fourth hard mask layer 332 may be formed of a material having different etch characteristics than the material of the buffer layer 330 to provide a desired etch selectivity with respect to the buffer layer 330. The fourth hard mask layer 332 may be formed of an oxide layer, a nitride layer, an oxynitride layer and/or a polysilicon layer. For example, if the buffer layer 330 is formed of an ACL, the fourth hard mask layer 332 may be formed of SiON. Further, in the case that the buffer layer 330 is formed of bottom resist material, the fourth hard mask layer 332 may be formed of a plasma-enhanced oxide layer. The fourth hard mask layer 332 may be formed with a thickness of about 1000 Å-3000 Å.

A second photoresist pattern 140 may be formed on the fourth hard mask layer 332 by the method described in reference to FIG. 5C.

Figure 7E:
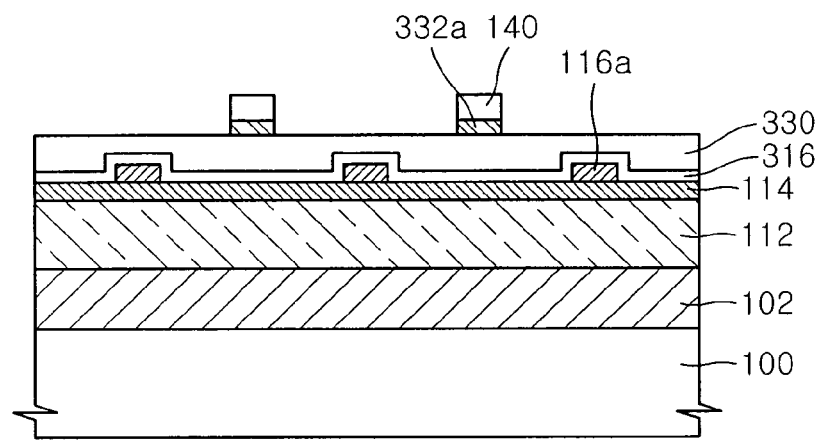

Referring to FIG. 7E, the fourth hard mask layer 332 may be anisotropically etched using the second photoresist pattern 140 as an etch mask, forming a fourth hard mask pattern 332a. After etching, a portion of the second photoresist pattern 140 may remain on the fourth hard mask pattern 332a.

Figure 7F:
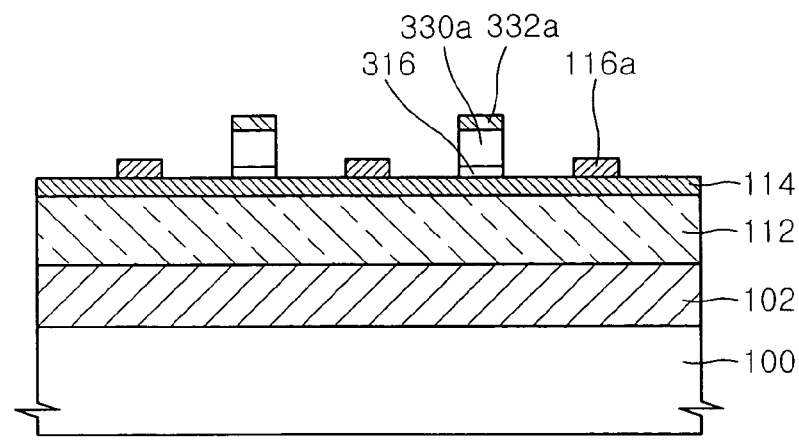
Figure 7G:
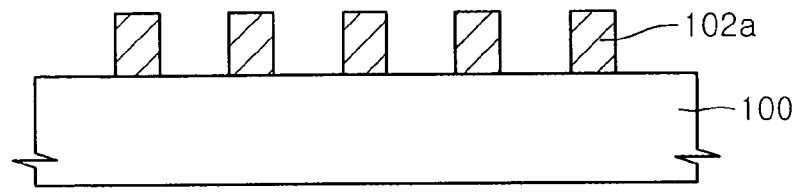

Referring to FIG. 7F, the buffer layer 330 may be etched using the fourth hard mask pattern 332a as an etch mask, forming a buffer layer pattern 330a. When the buffer layer 330 is etched, the capping layer 316 disposed thereunder may be exposed. The exposed capping layer 316 may be removed. The capping layer 316 may be etched and removed concurrently during the etching of the buffer layer 330 in accordance with etch characteristics of its component materials. Alternatively, additional etch process may be performed to remove the exposed capping layer 316 under separate etch conditions. As a result of removing the exposed portion of the capping layer 316, the third hard mask pattern 116a and/or the buffer layer pattern 330a, which may be covered with the fourth hard mask pattern 332a, may be exposed on the semiconductor substrate 100.

The second hard mask layer 114 may be anisotropically etched using the third hard mask pattern 116a and/or the buffer layer pattern 330a as etch masks by a method similar to that described in reference to FIG. 5E, forming a second hard mask pattern 114a. The first hard mask layer 112 may be anisotropically etched by a method similar to that described in reference to FIG. 5F, forming the first hard mask pattern 112a. Then, the layer 102 may be anisotropically etched using the first hard mask pattern 112a as an etch mask, forming a pattern 102a as described in FIG. 7G.

FIGS. 8A through 8E are sectional views illustrating a method of forming a finer pattern of a semiconductor device according to an example embodiment of the present invention.

According example embodiments of the present invention, a buffer layer formed of an ACL may be used as a bottom resist in an MLR process. A hard mask layer may be formed on the buffer layer in order to retard, or prevent, the occurrence of a bridge phenomenon between adjacent patterns. Further, a capping layer may be formed to protect the hard mask layer in order to reduce, or prevent, a pitting phenomenon. In FIGS. 8A through 8E, like numerals as in FIGS. 6A-6H refer to like elements, and detailed description thereof will be omitted.

Figure 8A:
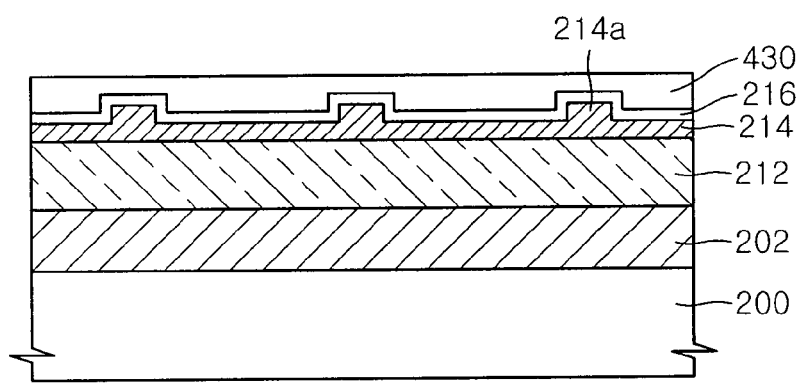
FIGS. 8A through 8E are sectional views illustrating a method of forming a finer pattern of a semiconductor device according to an example embodiment of the present invention.

Referring to FIGS. 8A, a first hard mask layer 212 and/or a second hard mask layer 214 may be sequentially formed on a semiconductor substrate 200 having a layer 202 to be etched. The layer 202 may be formed by a method similar as described in reference to FIGS. 6A-6C. A portion of the second hard mask layer 214 may be etched using a first photoresist pattern 220 (refer to FIG. 6A), forming a protrusion portion 214a protruded on the upper surface of the second hard mask layer 214. A capping layer 216 may be formed to substantially cover the upper surface of the second hard mask layer 214 including the protrusion portion 214a. The capping layer 216 may be omitted.

A buffer layer 430 may be formed on the capping layer 216 by a method similar to the formation of the buffer layer 330 as described in reference to FIG. 7C.

Figure 8B:
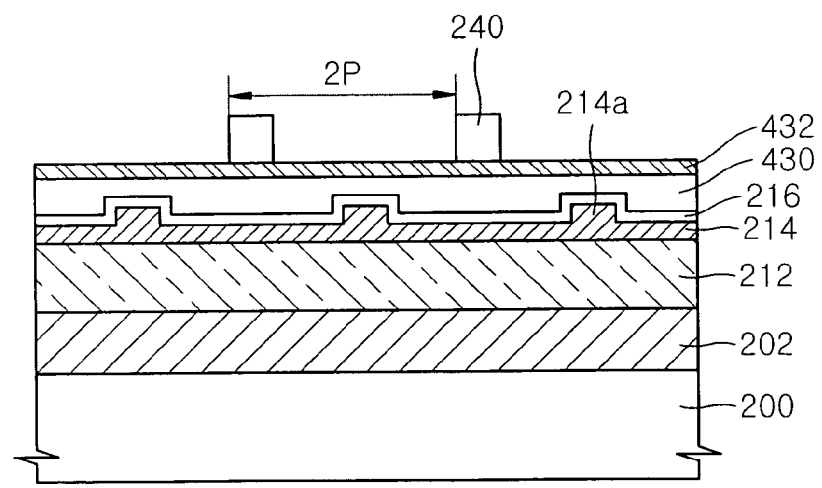

Referring to FIG. 8B, a third hard mask layer 432 may be formed on the buffer layer 430 by a method similar to the formation of the third hard mask layer 332 as described in reference to FIG. 7D. A second photoresist pattern 240 may be formed on the third hard mask layer 432 by a method similar as described in reference to FIG. 6D.

Figure 8C:
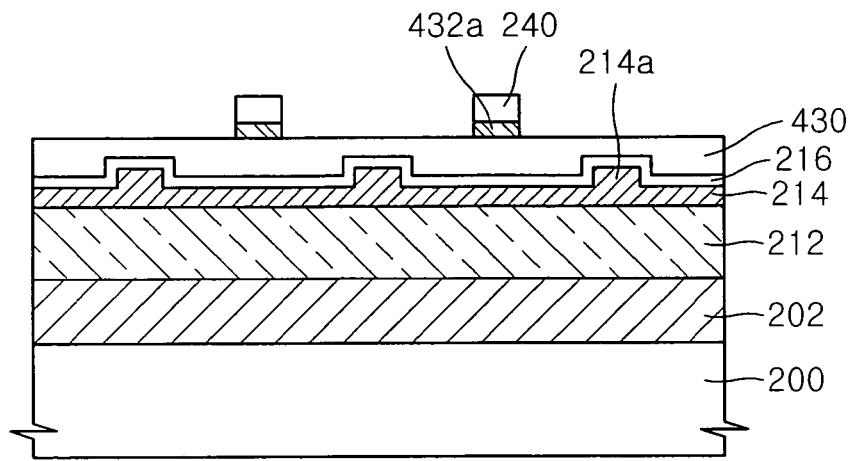

Referring to FIG. 8C, the third hard mask layer 432 may be anisotropically etched using the second photoresist pattern 240 as an etch mask, forming a third hard mask pattern 432a.

Figure 8D:
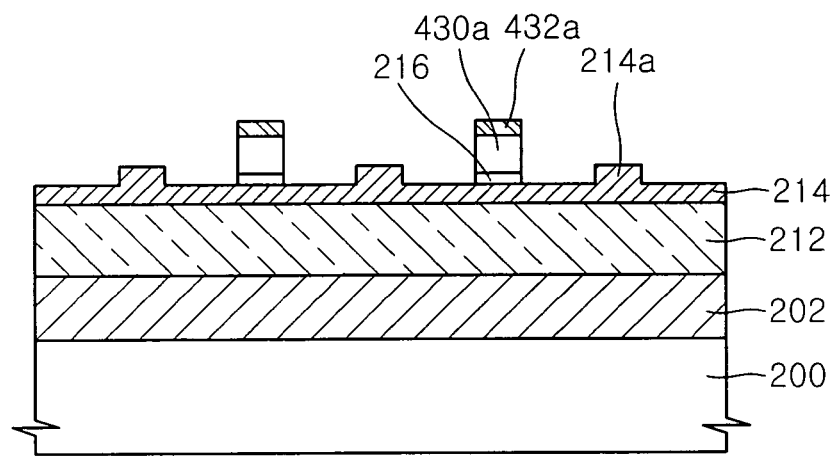

Referring to FIG. 8D, the buffer layer 430 and/or the capping layer 216 may be anisotropically etched using the third hard mask pattern 432a as an etch mask by a method similar to that described in reference to FIG. 7F, forming a buffer layer pattern 430a.

Figure 8E:
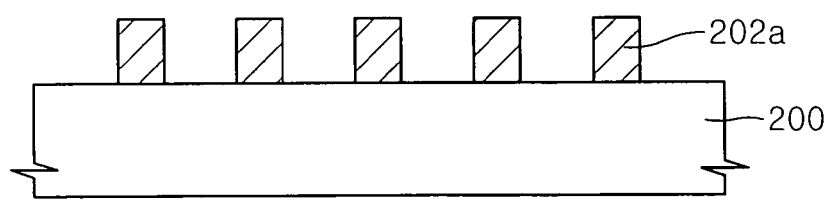

An anisotropic etch process may be performed using the protrusion portion 214a of the second hard mask layer 214 and/or the buffer layer pattern 430a as etch masks by a method similar as described in reference to FIGS. 6F through 6H, forming a pattern 202a as described in FIG. 8E.

As described in the above methods of forming a finer pattern of a semiconductor device according to example embodiments of the present invention, a finer pattern having a pitch approximately ½ the minimum pitch may be achieved by patterning using a conventional exposure apparatus using a double patterning technique. During the formation of a finer pattern by a second photolithography process, a second pattern may be formed after a buffer layer is formed in order not to offset the pattern formed by a first photolithography process. Defects such as the formation of bridges between the first pattern and the second pattern may be prevented. Further, by employing a capping layer covering a hard mask layer, occurrence of a pitting phenomenon and/or a protrusion-shaped defect on a semiconductor substrate may be suppressed.

According to example embodiments of the present invention, smaller-sized device may be fabricated using a conventional exposure apparatus. Further, resolution limitations in a photolithography process to form a pattern having a pitch of 40 nm or less may be overcome. Overcoming resolution limitations may reduce or prevent the formation of bridges between adjacent patterns or pattern failures due to a pitting phenomenon, and increase pattern fidelity and/or CD uniformity.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A method of fabricating a semiconductor device comprising:
    depositing a base layer on a substrate;
    forming a first hard mask layer on the base layer;
    forming a second hard mask layer on the first hard mask layer;
    forming a first etch mask pattern on the second hard mask layer wherein the first etch mask pattern is repeatedly formed having a first pitch;
    forming a buffer layer on a surface of a resultant structure having the first etch mask pattern;
    forming a second etch mask pattern on the buffer layer using a photolithography process, wherein the second etch mask pattern is repeatedly formed having the first pitch between the first etch mask pattern;
    etching the buffer layer using the second etch mask pattern as an etch mask, forming a buffer layer pattern;
    etching the second hard mask layer using the first etch mask pattern and the buffer layer pattern as etch masks, forming a second hard mask pattern having a second pitch wherein the second pitch is a half of the first pitch;
    etching the first hard mask layer using the second hard mask pattern as an etch mask, forming a first hard mask pattern which is repeatedly formed having the second pitch; and
    etching the base layer using the first hard mask pattern as an etch mask, forming a pattern which is repeatedly formed having the second pitch.

2. The method according to claim 1, wherein the first hard mask layer is formed of an amorphous carbon layer (ACL).

3. The method according to claim 1, wherein forming the first etch mask pattern includes forming a single layer of a material selected from the group consisting of an oxide layer, a nitride layer, an oxynitride layer and a polysilicon layer or a composite layer thereof.

4. The method according to claim 1,
    wherein forming the first etch mask pattern includes forming a third hard mask layer on the second hard mask layer; forming a first photoresist pattern having the first pitch on the third hard mask layer; and etching the third hard mask layer using the first photoresist pattern as an etch mask, forming a third hard mask pattern.

5. The method according to claim 4, wherein forming the second hard mask layer includes using a material having different etch characteristics than etch characteristics of the first hard mask layer; and forming a single layer of a material selected from the group consisting of an oxide layer, a nitride layer, an oxynitride layer and a polysilicon layer or a composite layer thereof.

6. The method according to claim 4, wherein forming the third hard mask layer includes using a material having different etch characteristics than etch characteristics of the second hard mask layer; and forming a single layer, wherein the material is selected from the group consisting of an oxide layer, a nitride layer, an oxynitride layer and a polysilicon layer or a composite layer thereof.

7. The method according to claim 1, wherein forming the first etch mask pattern includes forming a first photoresist pattern having the first pitch on the second hard mask layer; and etching a portion of the second hard mask layer to a desired thickness from a total thickness of the second hard mask layer, using the first photoresist pattern as an etch mask, forming a protrusion portion under the first photoresist pattern.

8. The method according to claim 7, wherein forming the second hard mask layer includes using a material having different etch characteristics than etch characteristics of the first hard mask layer; and forming a single layer of a material selected from the group consisting of an oxide layer, a nitride layer, an oxynitride layer and a polysilicon layer or a composite layer thereof.

9. The method according to claim 1, further comprising:

forming a capping layer on the surface of the resultant structure having the first etch mask pattern prior to forming the buffer layer.

10. The method according to claim 9, wherein forming the second hard mask layer includes using a material having different etch characteristics than etch characteristics of the first hard mask layer; and forming a single layer of a material selected from the group consisting of an oxide layer, a nitride layer, an oxynitride layer and a polysilicon layer or a composite layer thereof.

11. The method according to claim 9, wherein forming the capping layer includes using at least one material selected from the group of an ACL, an organic anti-reflective coating (ARC) layer, lower viscosity polymer, an oxide layer and an oxynitride layer.

12. The method according to claim 9, wherein the capping layer is formed with a thickness of about 50 Å-1000 Å.

13. The method according to claim 9, wherein forming the capping layer includes forming a capping material layer on the surface of the resultant structure having the first etch mask pattern; and performing multi-steps of thermal treatment on the capping material layer.

14. The method according to claim 13, wherein the multi-steps of thermal treatment includes sequentially performing a soft bake process of thermally processing at a first temperature and a hard bake process of thermally processing at a second temperature higher than the first temperature.

15. The method according to claim 1, wherein forming the buffer layer includes using a bottom resist material in a bi-layer resist (BLR) process, and forming the second etch mask pattern includes using a photoresist pattern containing silicon (Si).

16. The method according to claim 15, wherein forming the buffer layer includes coating the surface of the resultant structure having the first etch mask pattern with the bottom resist material; and baking the bottom resist material by a hard bake process.

17. The method according to claim 1, further comprising:

forming a fourth hard mask layer on the buffer layer, prior to forming the second etch mask pattern; and etching the fourth hard mask layer using the second etch mask pattern as an etch mask, forming a fourth hard mask pattern.

18. The method according to claim 17, wherein forming the buffer layer includes using an amorphous carbon layer (ACL) or a bottom resist material; and forming the fourth hard mask layer includes using a material having different etch characteristics than etch characteristics of the buffer layer material.

19. The method according to claim 17, wherein forming the fourth hard mask layer includes using a single layer wherein the material is selected from the group consisting of an oxide layer, a nitride layer, an oxynitride layer and a polysilicon layer or a composite layer thereof.

20. The method according to claim 1, wherein forming the buffer layer includes covering any height differences on the substrate; and forming a flat upper surface.

21. The method according to claim 1, wherein forming the buffer layer includes depositing a buffer material on the surface of the resultant structure having the first etch mask pattern; and polishing the deposited buffer material such that an upper surface thereof is planarized.

22. The method according to claim 1, further comprising:

forming an organic anti-reflective coating (ARC) layer on the surface of the resultant structure having the first etch mask pattern, prior to forming the buffer layer.

23. The method according to claim 1, forming the second etch mask pattern includes forming a third hard mask layer on the buffer layer; forming a second photoresist pattern having the first pitch on the third hard mask layer; and etching the third hard mask layer using the second photoresist pattern as an etch mask, forming a third hard mask pattern.

\* \* \* \* \*